United States Patent [19]

Shiba et al.

[11] Patent Number: 4,706,106
[45] Date of Patent: Nov. 10, 1987

[54] SEMICONDUCTOR LIGHT RECEIVING DEVICE

[75] Inventors: Tetsuo Shiba, Suita; Kazuhisa Takahashi, Itami; Kenji Ikeda, Hyogo; Hideyo Higuchi, Takarazuka, all of Japan

[73] Assignee: Mitsubishi Denki Kabushiki Kaisha, Tokyo, Japan

[21] Appl. No.: 743,747

[22] Filed: Jun. 12, 1985

[30] Foreign Application Priority Data

Jun. 14, 1984 [JP] Japan .................. 59-124145

[51] Int. Cl.$^4$ .................. H01L 23/26
[52] U.S. Cl. .................. 357/78; 357/74; 174/52 S; 174/52 H
[58] Field of Search .............. 357/78, 74; 174/52 H, 174/52 P, 52 S

[56] References Cited

U.S. PATENT DOCUMENTS

| 2,777,974 | 1/1957 | Brattain et al. | 357/52 |
| 4,345,108 | 8/1982 | Dathe et al. | 357/74 |

FOREIGN PATENT DOCUMENTS

| 3125622A1 | 1/1981 | Fed. Rep. of Germany . |
| 2548455 | 1/1985 | France . |
| 55-98877 | 7/1980 | Japan . |
| 0148429 | 9/1983 | Japan .................. 357/78 |

OTHER PUBLICATIONS

"Polymide Passivation of $In_{0.53}Ga_{0.47}As$, InP, and InGaAsP/InP p-n Junction Structures", R. Yeats et al., Applied Physics Letters, Jan. 1984, pp. 145, 146 and 147.
European Search Report citation sheet, Application No. EP 85 30 4227.

Primary Examiner—James W. Davie
Assistant Examiner—Georgia Y. Epps
Attorney, Agent, or Firm—Birch, Stewart, Kolasch & Birch

[57] ABSTRACT

A semiconductor light receiving device, including; a photo diode having a polyimide film as a surface protection film, and a hermetically sealed package including the photo diode in an ambient gas including oxygen.

3 Claims, 3 Drawing Figures

SEMICONDUCTOR LIGHT RECEIVING DEVICE

FIELD OF THE INVENTION

The present invention relates to a semiconductor light receiving device.

BACKGROUND OF THE INVENTION

FIG. 1 shows a semiconductor light receiving device which is widely used. The reference numeral 1 designates a photo diode. The numeral 2 designates a heatsink. The numeral 3 designates a lead wire. The numeral 4 designates a circular stem on which the heatsink 2 is mounted. The numeral 6 designates a cap. The numeral 7 designates a glass plate window for taking in the incident light. The numeral 8 designates a sealing glass. The numeral 9 designates an electrode. Nitrogen gas is used as the ambient gas 5. It has a dew point that is is low, and it is an inactive gas that has a low cost.

Conventionally, in a mesa-type InGaAs photo diode as an example of the above-described photo diode 1 there is a problem that a yield is low because of a deterioration that occurs at its construction.

On the other hand, a polyimide film has begun to be used as a new surface protection film. FIG. 2 shows a prior art mesa-type InGaAs photo diode which uses a polyimide film. The numerals 14, 13, and 12 designate an n-type InP layer, an n-type InGaAs layer, and a p-type InGaAs layer, respectively, and the numeral 11 designates an electrode. The numeral 15 designates a polyimide film as a surface protection film.

In the semiconductor light receiving device constituted by mounting an InGaAs photo diode with a polyimide film attached to the surface thereof in the package shown in FIG. 1, the incident light 10 from the outside is converted into a current by the photo diode 1, and electrode 9 outputs the converted current.

In the semiconductor light receiving device using a polyimide film, there arises no deterioration at the tie of construction, and a high yield is obtained. Thus it is greatly expected that these devices are put to practical use.

In those devices using a polyimide film, however, the initial value of the dark current is likely to be relatively high, and the dark current is likely to increase as the cumulative amount of time during which the device produces turn-on-electricity, the ON-TIME, increases.

The following is a description concerned with the problem of the dark current:

FIG. 3 shows a dark current vs cumulative ON characteristics at a high test temperature test in the semiconductor light receiving device. The curve A shows the characteristics of the prior art device where the nitrogen gas is sealed after a polyimide film is produced. The curve B shows the characteristics of the prior art device where the nitrogen gas is sealed without producing a polyimide film. As apparent from the curve B, the dark current does not increase in the range of several hundreds of hours of cumulative ON time in the device having no polyimide film. On the contrary, as apparent from the curve A, a rapid increase of the dark current occurs in the above-mentioned range of ON time in the device having a polyimide film.

Another prior art publication, "Polyimide passivation of $In_{0.53}Ga_{0.47}As/InP$, and InGaAsP/InP p-n junction structures". by R. Yeats and K. von Dessonneck. Apply. Phys. Lett. 44(1), 1 Jan. 1984, reports that an element having a low dark current is obtained by conducting a passivation to $In_{0.53}Ga_{0.47}As/InP$ homo-junction photo diode using a polyimide film.

SUMMARY OF THE INVENTION

The inventor has found that the increase of the dark current in the semiconductor light receiving device having the polyimide film is based on a change that occurs at the polyimide film or the boundary surface between the polyimide film and the crystal during the ON time at an elevated temperature due to the influence of the nitrogen ambient gas.

The present invention is directed to solve the problems pointed out above, and has the purpose to provide a semiconductor light receiving device capable of preventing the increase of the dark current while operating to produce electricity at an elevated temperature, and also being capable of obtaining a high reliability.

Other objects and advantages of the present invention will become apparent from the detailed description given hereinafter; it should be understood, however, that the detailed description and specific embodiment are given by way of illustration only, since various changes and modifications within the spirit and scope of the invention will become apparent to those skilled in the art from this detailed description.

There is provided a semiconductor light receiving device, which comprises; a photo diode having a polyimide film as a surface protection film, and a hermetically sealed package, including the photo diode in an ambient gas including oxygen.

DETAILED DESCRIPTION OF THE PREFERRED EMBODIMENTS

Figure 1:
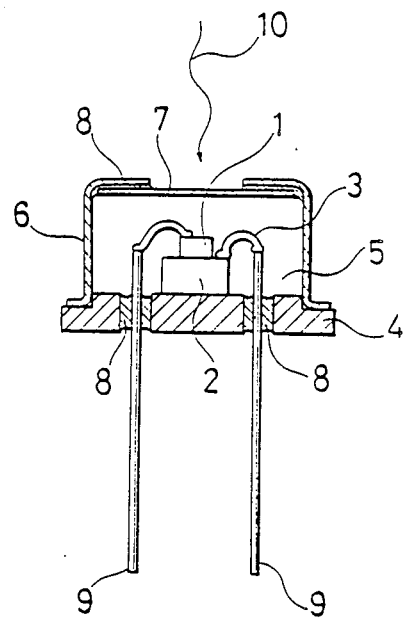
FIG. 1 is a cross-sectional view showing a semiconductor light receiving device as one embodiment of the present invention.
Figure 2:
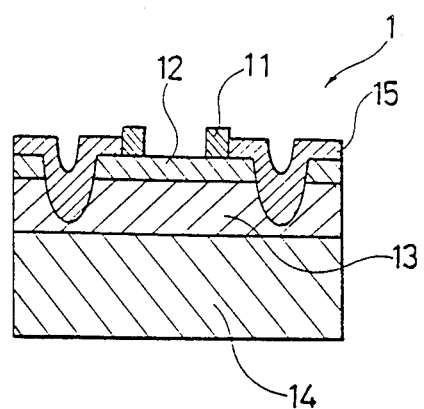
FIG. 2 is a cross-sectional view showing a mesa-type InGaAs photo diode as one example of a photo diode used in the semiconductor light receiving device of FIG. 1.

The semiconductor light receiving device according to the present invention is obtained by replacing the ambient gas in the hermetically sealed package shown in FIG. 1 by dried air.

Figure 3:
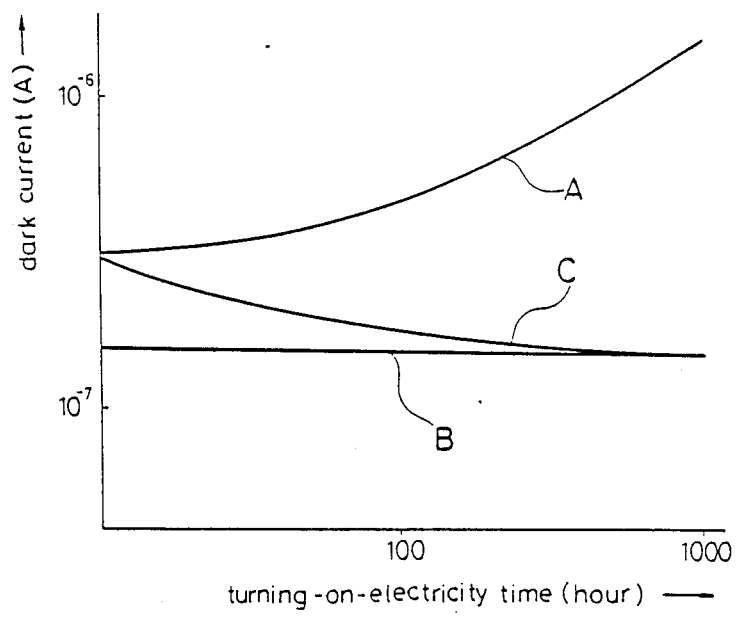
FIG. 3 is a diagram showing a dark current vs cumulative turning-on-electricity time characteristics at a high temperature during the operation of producing electricity for explaining the improvement of the dark current in the preferred embodiment.

The effects of the improvement of the deterioration according to the present invention will be described with reference to FIG. 3:

In FIG. 3 the curve C shows a dark current vs cumulative ON time characteristics of the device of the present invention. As apparent from the curve C, the dark current decreases with the increase in ON time, reaching the value almost equal to that obtained when the polyimide film is not coated. It is believed that this is the result of the oxygen in the dried air favourable influencing the quality of the polyimide film, thereby reducing the dark current.

As is evident from the foregoing description, dried air is used as a sealed ambient gas, whereby the increase of the dark current is prevented. Furthermore, the dried air is cheap as compared with the conventional nitrogen gas, resulting in an inexpensive device.

In the illustrated embodiment, dried air is used as an ambient gas, however, oxygen gas can be used instead of the dried air because it is thought that the oxygen gas included in the dried air is pertinent to the improvement of the dark current.

In the illustrated embodiment a semiconductor light receiving device using a photo diode is used, but the present invention can be applied to a semiconductor device using an element other than a photo diode.

As described above, according to the present invention, a gas that includes oxygen is used as the sealed ambient gas in a semiconductor light receiving device with a polyimide film as a surface protection film. It is possible to prevent the increase of the dark current, and to obtain a semiconductor light receiving device having a high reliability.

What is claimed is:

1. A semiconductor light receiving device, which comprises:
   a photo diode having a polyimide film as a surface protection film;
   an airtightly sealed package containing said photo diode; and
   an ambient gas including means for preventing an increase in a dark current characteristic of said light receiving device, said means for preventing consisting essentially of oxygen of a sufficient concentration in said ambient gas to prevent said increase in the dark current characteristic of said light receiving device.

2. The device of claim 1 wherein said ambient gas is dried air.

3. The device of claim 1 wherein said ambient gas is an oxygen gas.

* * * * *